(12) United States Patent
Motika et al.

(10) Patent No.: US 8,843,797 B2
(45) Date of Patent: Sep. 23, 2014

(54) SIGNATURE COMPRESSION REGISTER INSTABILITY ISOLATION AND STABLE SIGNATURE MASK GENERATION FOR TESTING VLSI CHIPS

(75) Inventors: Franco Motika, Hopewell Junction, NY (US); Raymond J. Kurtulik, Cornwall-on-Hudson, NY (US); John D. Parker, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 177 days.

(21) Appl. No.: 13/534,444

(22) Filed: Jun. 27, 2012

(65) Prior Publication Data

US 2014/0006889 A1    Jan. 2, 2014

(51) Int. Cl.
*G01R 31/28* (2006.01)
*G06F 11/27* (2006.01)
*G01R 31/3193* (2006.01)

(52) U.S. Cl.
CPC ............ *G06F 11/27* (2013.01); *G01R 31/3193* (2013.01)
USPC ................. 714/732; 714/25; 714/30; 714/31; 714/715; 714/726; 714/728; 714/729; 714/733; 714/736; 714/739; 714/745

(58) Field of Classification Search
CPC ..... G06F 11/27; G06F 11/277; G06F 11/267; G01R 31/318547; G01R 31/318385; G01R 31/3187; G01R 31/3193
USPC ............... 714/732, 25, 30, 31, 715, 726, 728, 714/729, 733, 736, 739, 745
See application file for complete search history.

(56) References Cited

U.S. PATENT DOCUMENTS

| | | | |
|---|---|---|---|
| 4,510,572 A | 4/1985 | Reece et al. | |
| 4,534,030 A | 8/1985 | Paez et al. | |
| 6,021,514 A | 2/2000 | Koprowski | |
| 6,715,105 B1* | 3/2004 | Rearick | 714/30 |
| 6,807,645 B2* | 10/2004 | Angelotti et al. | 714/732 |
| 6,950,974 B1* | 9/2005 | Wohl et al. | 714/733 |
| 7,437,640 B2 | 10/2008 | Rajski et al. | |
| 7,475,311 B2* | 1/2009 | Kiryu | 714/732 |
| 7,610,572 B2 | 10/2009 | Kanno et al. | |
| 7,644,333 B2* | 1/2010 | Hill et al. | 714/732 |
| 7,925,947 B1 | 4/2011 | Touba et al. | |
| 2005/0050420 A1* | 3/2005 | Hapke | 714/733 |
| 2005/0066244 A1* | 3/2005 | Jas et al. | 714/732 |
| 2009/0210762 A1* | 8/2009 | Wang et al. | 714/729 |
| 2010/0218059 A1* | 8/2010 | Gangasani et al. | 714/728 |
| 2010/0253381 A1 | 10/2010 | Hapke et al. | |

* cited by examiner

*Primary Examiner* — John Trimmings
(74) *Attorney, Agent, or Firm* — H. Daniel Schnurmann (57) ABSTRACT

A method for detecting unstable signatures when testing a VLSI chip that includes adding to an LFSR one or more save and restore registers for storing an initial seed consisting of 0s and 1s; loading the initial seed into the LFSR and one or more save and restore registers; initializing a MISR and running test loops. Upon reaching a predetermined number of test loops, moving a signature of the MISR to a shadow register; then, performing a signature stability test by loading the initial seed to the LFSR; executing the predetermined number of BIST test loops, and comparing a resulting MISR signature for differences versus a previous signature stored in a MISR save and restore register, wherein unloading is performed by way of serial MISR unloads and single bit XORs.

19 Claims, 7 Drawing Sheets

SIGNATURE COMPRESSION REGISTER INSTABILITY ISOLATION AND STABLE SIGNATURE MASK GENERATION FOR TESTING VLSI CHIPS

FIELD OF THE INVENTION

The present invention relates to the testing of Very Large Integrated Circuits (VLSI) devices, and more particularly, to a design-for-test that automatically detects multiple unstable signatures and associated instability in the source channels.

BACKGROUND

A problem presently encountered when testing large VLSI devices based on signature analysis is an occasional occurrence of unstable signatures. Unstable signatures result from indeterminate logic states, referenced to x-states, propagating through the logic circuits and subsequently being captured into the signature compression registers. Logic x-states frequently occur in large, high speed, high power and highly integrated devices, and are usually caused by environmental conditions, process variations and marginal designs. Examples of sources of the indeterminate logic states include signal propagation races, switching delta-I glitches, cross-coupling disturbs and marginal signal levels.

The unstable signature problem, usually found in Multiple Input Signature Registers (MISRs) configurations, becomes critical when automated manufacturing pass/fail testing and device disposition is based on a unique single 'good' signature comparison. Furthermore, it is often required to continue testing devices with known x-state conditions using signature analysis methods. To support the test capability, one needs to determine the cause of instability, the range of unstable signatures and provide an appropriate masking for the signature register inputs.

When a long stream of binary data ("0"s and "1"s) is compressed into a fixed length binary signature (e.g., 32-bits) using a software or hardware compression algorithm, the technique is referred to as signature generation. As used in testing, the long stream of binary data can include responses from a logic or array structure over many test cycles and multiple outputs.

There are many compression and signature generation methods and algorithms. A common approach in communications and testing in generating signatures is the use of a Linear Feedback Shift Register (LFSR) with XOR inputs to alter the LFSR state machine sequence depending on the input data. The resulting MISR state, e.g., at the end of a test section, is referred to as the signature. Analyzing and comparing the final signature to the expected 'good' machine signature is referred to as the Signature Analysis (SA).

Binary signatures consist of only "0"s and "1"s. The "x" state referrers to the unstable signature can also be a "0" or "1" but it is unstable, namely, it changes states unpredictably and intermittently when executing the same test several times, usually resulting in a different final signature. An unstable signature is often caused by several "x" states being compressed during a signature generation test. The "x" state, as previously described, does not "kill" the signature, but rather it modifies its value to an unexpected state. Since the unstable signature results from the "x" state, any marginal test condition can result in the indeterminate states. Extending the test setup conditions, such as voltage, frequency, temperature, and the like, associated with marginal designs can expose the instabilities. Analyzing the signatures with respect to the above setup test variables can determine the source of instability and potentially optimize and improve the power/performance and operating range of the device.

SUMMARY

In one aspect of the invention, an embodiment provides a design-for-test (DFT) that automatically detects multiple unstable signatures and associated instability source channels (i.e., the input data stream for each MISR input, e.g., a MISR consisting of one input channel per MISR latch. A Built-in Diagnostic function complements the built-in self test (BIST), generating a stable signature mask intended for use in an automated manufacturing test flow.

In another aspect of the invention, an embodiment can add new signature bootstrapping to obtain signatures determined empirically by performing a test on a 'good' reference device or a test setup 'reference' point on the same device, and subsequently to use the acquired signature as the signature when testing the devices employing the 'save and restore' register, and compare functions to the BIST configuration and control. The embodiment utilizes reconfigurable pseudo-random generators to generate stimuli for the logic test and means for compressing responses, preferably in the form of signatures. New DFT functions are also compatible and advantageously employ Selective Signature Generation (SSG), i.e., 'channel masking' gating or selecting, permitting the BIST engine control to enable or disable any combination of input channels to the MISR. SSG further diagnoses the MISR signature instability source. Added thereto are diagnostic controls used to select appropriate channels tested for signature instability.

In still another aspect, an embodiment can employ existing reconfigurable LFSRs to generate the stimuli for the logic test, and a MISR to provide a response compression and signature generation.

In yet another aspect, an embodiment provides a new DFT added to the above existing BIST structure, including: a) an LFSR initial seed 'save and restore' support using a 'shadow' register; b) a mask individual stump chain and mask select sequence controller; c) previous MISR signature save support using a 'shadow' register; d) a serial XOR signature compare; and e) an enhanced BIST controller to loop and sequence all the MISR input channels.

An embodiment provides multiple unstable signatures and associated instability source channel to be automatically detected and isolated. The embodiment can further generate an unstable channel mask used advantageously for manufacturing testing, exposing unstable signatures at full system timing rates; and detect instability over full operating ranges; voltage, frequency and temperatures. The embodiment is applicable at various levels of test, spanning from a wafer to a system in the field without requiring large test result dumps for off-line diagnostics. The embodiments can be easily integrated in current test system architecture and test flow without the need of extensive pattern generation.

A further embodiment provides a method of detecting unstable signatures when testing a VLSI chip, the method including: adding to an LFSR one or more save and restore registers for storing an initial seed consisting of 0and 1s; loading the initial seed into the one or more save and restore registers upon reaching a predetermined number of test loops; and performing a signature stability test by loading the initial seed to the LFSR, executing the predetermined number of BIST test loops, and comparing the resulting MISR signature for differences versus the previous signature stored in a MISR save and restore register.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings.

DETAILED DESCRIPTION

Within the scope of embodiments of the invention, a "signature" is defined as the binary sequence contained in a linear data compression register at the conclusion of a test sequence.

An "unstable signature" is referred as one that is not repeatable upon subsequent executions of the same test using identical initial state conditions. The non-repeatable binary sequence resulting from the existence of indeterminate states propagate through the logic elements during test and accumulate in the response compression register.

Figure 1:
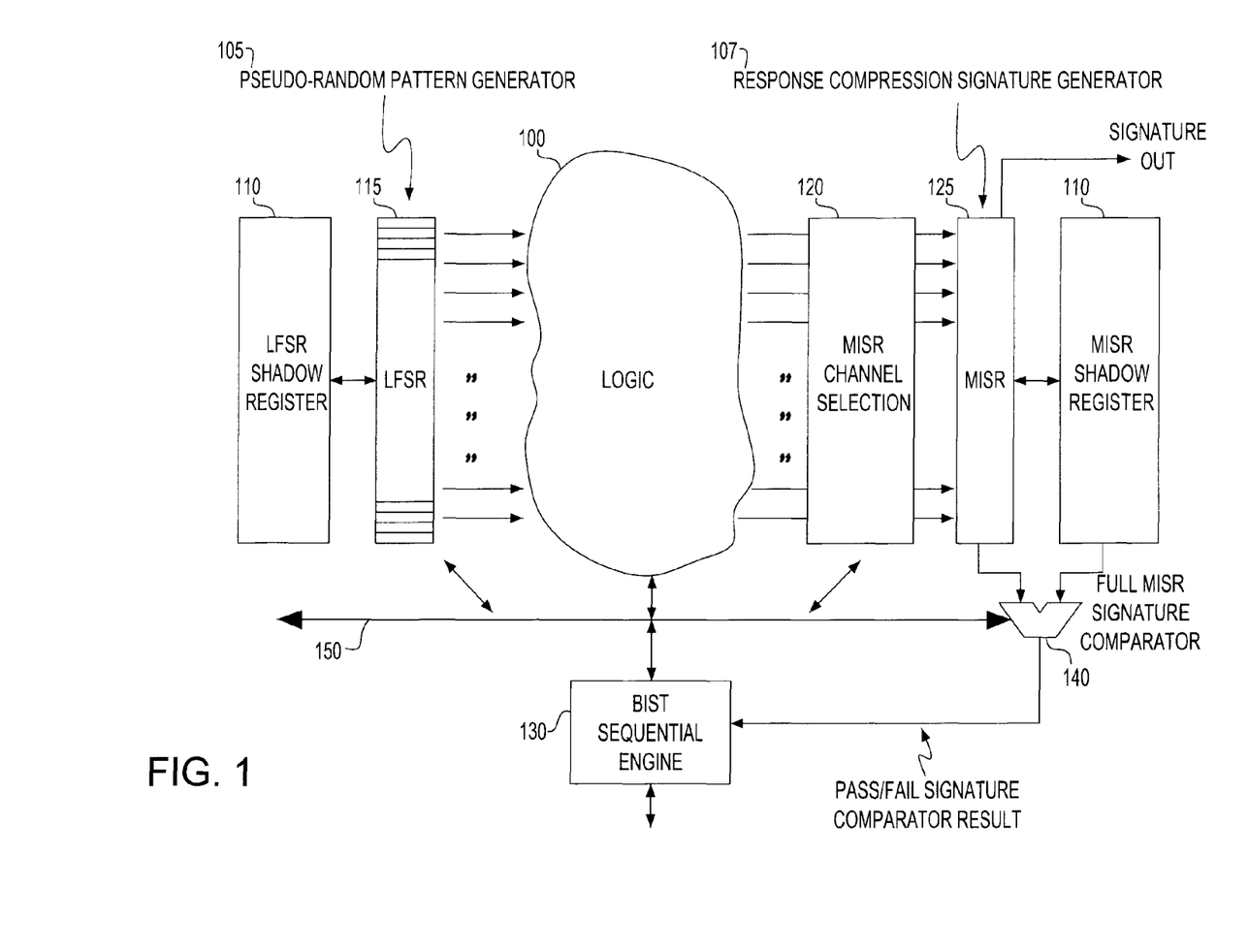
FIG. 1 is a diagram illustrating an unstable signature detect, showing a BIST employing the signature analysis and support for detecting unstable signatures.

Referring to FIG. 1, an overview of the main functional features is illustrated. An LFSR is provided with an added "shadow" also referred to as a "save and restore" LFSR that stores an initial seed, consisting "0" and "1" bits. The seed can be reloaded into the LFSR at the start of each test interval. The MISR stores or saves the current signature at the end of a test interval and then unloads it and compares the current signature to the signature stored in the MISR shadow register that preferably employs an XOR circuit. The 'shadow' registers associated with each LFSR and each MISR, i.e., simple 1-to-1 latch registers can preferably be used to temporarily save and restore the contents of the LFSR or MISR register, using the 'save and restore' registers to detect signature instability, and using the MISR shadow register as an integral MISR comparator. In each successive pass that consists of repeating the initial seed loads into the LFSR and N-test pattern applications, the resulting MISR signature is subsequently compared to its previously stored register signature. Each additional run with the same seed will compare the MISR signatures to its stored and restored register. Any mismatch occurring during a repeatability count of up to m-times will be flagged as an unstable test condition for the test interval sequence. Details of the test and diagnostic flow are further depicted with reference to FIGS. 4 and 5 described hereinafter.

Figure 3:
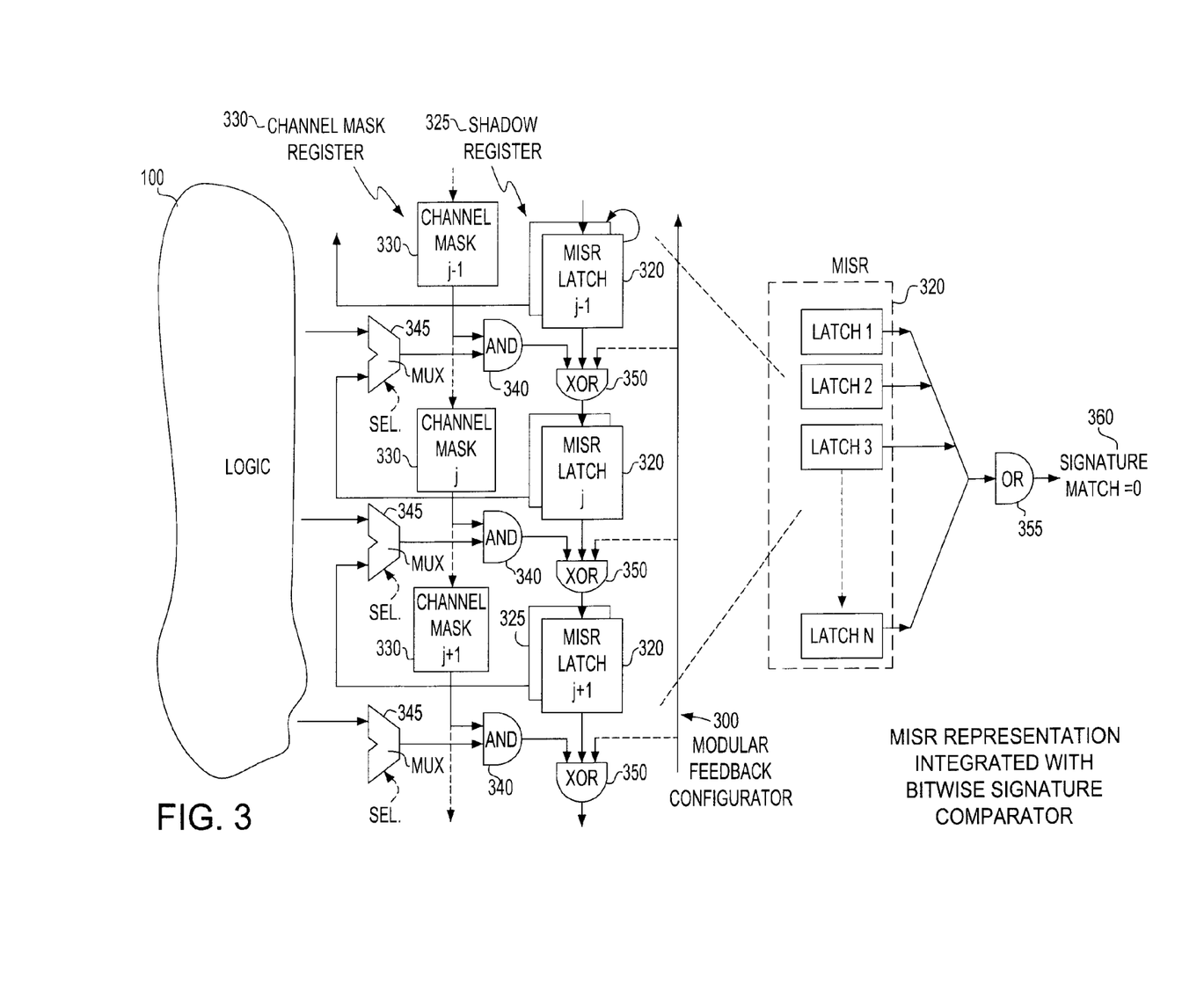
FIG. 3 illustrates the channel select and shadow register configuration in a single cycle parallel compare depicting a portion of a typical 'modular' feedback configuration MISR with the associated channel masking an integrated parallel single-shift-cycle signature compare function.

Although several signature compare methods can be used, a preferred embodiment can use a serial MISR unload and a single bit XOR selected to minimize the compare as shown in FIG. 3, the function thereof being overhead circuitry. Although a single LFSR/MISR test structure is illustrated, embodiments can be extended to include multiple STUMPs set to extend the instability detection and multiple stable MISR masks generation.

Still referring to FIG. 1 describing the unstable signature detect, there is shown a built-in self test (BIST) configuration employing signature analysis and support for detecting the unstable signatures. LFSRs can be used as pseudo-random stimuli generators and MISRs to obtain a response compression into signatures. A BIST engine can be preferably employed to control the test sequence, the "save and restore" registers for the LFSRs and MISRs, the channel selection registers to gate the MISRs inputs, and an integrated signature compare function.

Step 100 represents the logic tested by the surrounding built-in test support with stimuli generated by the Pseudo-Random Pattern Generator 105 and the responses compressed into the Response Compression Signature Generator 107. The clocking to the logic is shown to be provided by the BIST sequencing engine 130. Input stimuli to the logic are advantageously generated by the LFSR 115, while the responses are compressed into the MISR 125. The clocking generation and distribution is not specifically shown.

Step 105 shows a diagram for LFSR 115 pseudo-random stimuli generator and associated shadow register 110. One or more LFSRs 110, 115 can be configured as inputs for the logic being tested. Each LFSR can be either a "modular" or a "standard" feedback configuration.

Step 125 depicts a MISR similar to the LFSR with additional inputs to the XOR between the MISR latches. The associated 'shadow' register is depicted in Step 110. This enables a response compression into a digital signature of length equal to the number of MISR latches. One or more MISRs can be used as multiple independent signature generators. As with the LFSR, each MISR can be either a "modular" or a "standard" feedback configuration.

The "shadow" registers 110, for both the LFSRs and MISRs, provide the capability to save and restore the state of the LFSRs and MISRs for a desired test interval. The LFSR shadow register can be used to save the initial state of the LFSR, subsequently used to restart and repeat the equivalent test interval stimuli. Similarly, the MISR shadow register can be employed to save the previous test interval signature for subsequent comparison to the repeated interval signature.

The MISR channel selection register 120 allows gating each individual response channel into a MISR input. The MISR preferably consists of one input channel per MISR latch. (The channels, as previously referred are the input data stream for each MISR input). By selectively gating one or more MISR input channels, a stable signature can be realized and unstable channels identified.

The data and control bus 150 enables BIST engine control for all the above components. It also provides access to all the registers for loading and unloading data and further to supply system and control clocking.

Signature comparator 140 provides a serial comparison between the current MISR signature and the previous equivalent test interval signature stored in the MISR shadow register. Matching signatures indicate that the test interval produces a stable response.

The BIST sequential engine 130 controls the setup and execution of one or more test intervals. It loads all the LFSR and MISR initial seeds and feedback configurations, sequences the number of test cycles for each test interval and compares the signatures at the end of the intervals.

Figure 2:
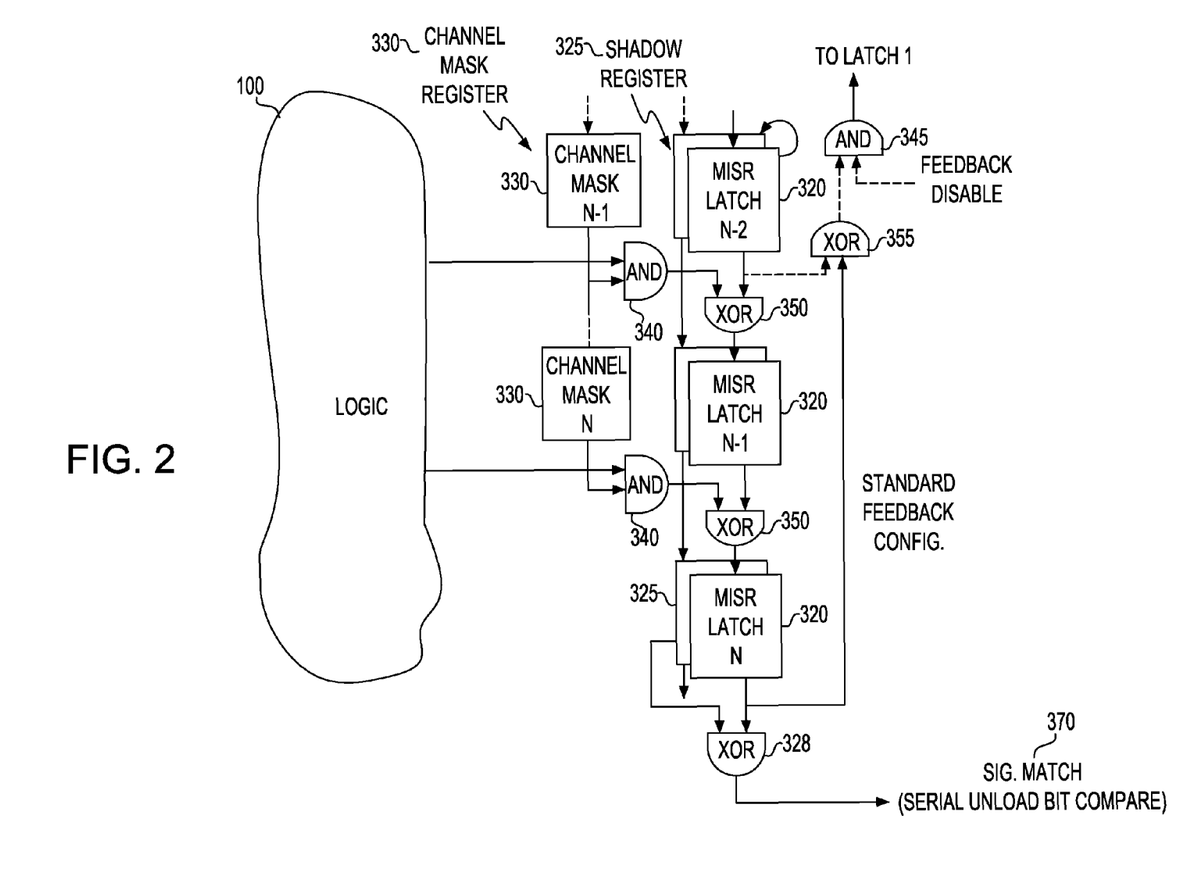
FIG. 2 illustrates a channel select and a shadow register configuration depicting a portion of a typical 'standard' feedback configuration MISR with associated channel masking and serial unload signature compare function.

Referring to FIG. 2, a channel select and shadow register configuration is illustrated using a serial compare. A portion of the feedback configuration MISR is depicted with the associated channel masking and the serial unload signature compare function.

Each MISR latch (1-N) 320 and associated 'save and restore' register (1-N) latch are configured into a LFSR. The state of the MISR can be stored in each individual corresponding shadow latch 325. Both, the MISR and the shadow registers can also be individually loaded during initial setup and unloaded via the serial shift ports.

The channel mask register 330 is used to enable or gate each individual MISR input. The channel mask register can also be individually loaded during initial setup and unloaded via the serial shift ports.

In Step 340, AND logic gates suppress the logic output feeding the specific MISR input by setting the corresponding channel mask latch to "0". This in turn results in a "0" state input XOR.

In Steps 350, XOR gates between each MISR 320 latch take the logic output channel state if not masked, and XORs it with the previous MISR latch state. Repeating the process for all the latches over many shift cycles results in a MISR signature representing the compression of all the inputs and MISR shift states.

XOR 328 at the output of the N-th MISR latch 320 and the N-th shadow 325 compares one bit at a time as it is shifted out or unloaded from the two registers. If all the latches match, i.e. XOR output for each bit is "0", then the signatures will also match.

One or more XORs 355 provide an LFSR feedback by XORing the selected latch outputs with the N-th latch output, and feed the result of the XOR tree to the first latch input. AND gates 345 are used to gate the feedback and disable the MISRing while unloading and comparing the current to previous interval signatures.

Still referring to FIG. 2, the process for generating the MISR mask is illustrated in the flowchart. All the MISR input channels can be gated off by the channel select register except for one channel at a time, which is checked in an iterative manner. Under control of the DFT BIST engine, the LFSR is loaded with the initial seed stored in the LFSR shadow register. The MISR is initialized and the n-loop BIST sequence is executed for the user-specified repeat of m-times. At the conclusion of the m=1 test, the content of the MISR is moved to the MISR shadow register for comparison on subsequent test iterations. The n-loop BIST test is then re-executed for iterations 2 through m. At the completion of each test, the MISR contents are compared to the value stored in the MISR shadow register by shifting both through the XOR comparison circuit. A non-zero XOR value, indicative of an unstable value in the currently enabled STUMPS chain, can result in a channel's instability being recorded by setting a corresponding bit in the MISR mask.

The above process is repeated for all the MISR input channels by enabling one at a time in the chain select register while gating off all the others. The n-loop BIST test is repeated m-times on each channel, the MISR and MISR 'shadow' register values being compared via the XOR. The channel stability or instability is preferably recorded in the MISR mask.

At the conclusion of the testing, the generated MISR mask is loaded to the channel select register. The stable signature mask is now in effect and traditional manufacturing BIST tests can be applied to the device under test (DUT). The embodiment ends at this time, concluding the test and diagnostic flow.

Other enhancements to the flow may include starting with a low n-cycle count and increasing it until the unstable signature is exposed, and is followed by isolating the source of instability. In another flow, optimization can invoke binary or predetermined mask selection searches instead of linear selection algorithms.

Referring to FIG. 3, the channel select and shadow register configuration is illustrated using a parallel compare. A portion of a typical 'modular' feedback configuration MISR is illustrated with the associated channel masking and integrated parallel single-shift-cycle signature compare function.

Similar to the previous FIG. 2, each MISR latch (1-N) 320 and associated 'save and restore' register (1-N) latch 325 are configured into an LFSR. The state of MISR can be saved in each individual corresponding shadow latch. Both, the MISR and the "shadow" registers can also be individually loaded during initial setup and unloaded via serial shift ports.

Input channel MUX function 345 enables the selection of the logic output data or the state of the corresponding shadow register latch. In the first selection mode, the MISR acts as a normal response compression and signature generation register, while in the second selection mode, the configuration allows the XOR comparison of the shadow register to the MISR. In the comparison mode, all the channel mask latches 330 are enabled and the LFSR feedback 300 disabled, allowing all latches comparison in a single shift cycle.

OR logic gate 355 sets the registers comparison result, a "0" state indicating a MISR and 'shadow' register signatures match, while a "1" state indicates a mismatch at output 360.

XORs 350 between each MISR latch receive the logic output of the previous MISR latch state 320, the input from the MUX and the channel mask AND gate 340, and an optional feedback 300 from the n-th MISR latch of a modular MISR configuration.

Figure 4:
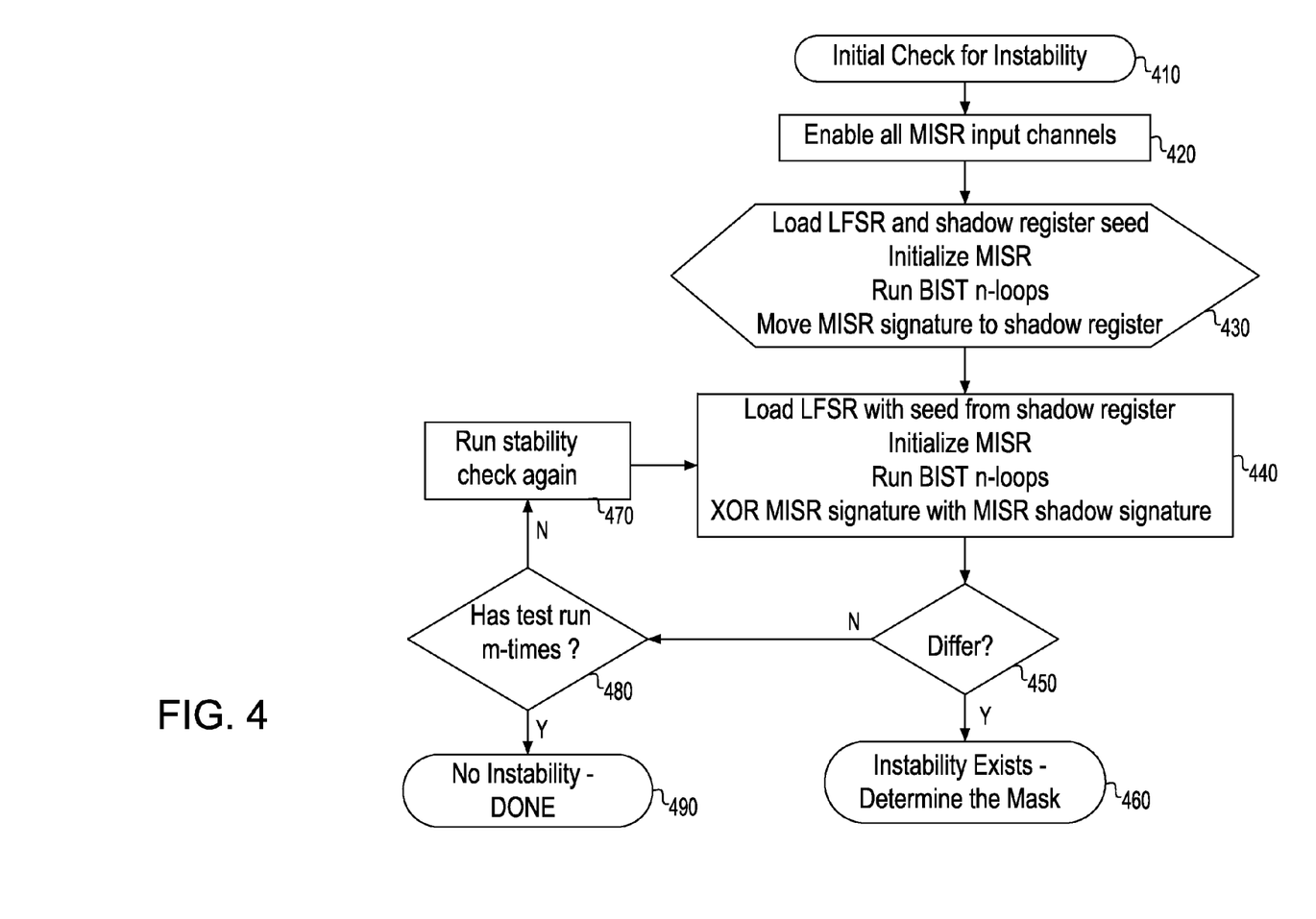
FIG. 4 shows an initial check for signature instability by way of a flowchart determining whether a need for channel masking exists for the circuit under test with user-defined test conditions of initial LFSR seed and number of BIST loops.

Referring now to FIG. 4, an initial check for signature instability is depicted. Shown therein 410, is a flowchart illustrating the steps that determine whether there is a need for a channel masking for the circuit under test having the user-defined test conditions of the initial LFSR seed and the number of BIST loops. The sequence is performed by an enhanced BIST engine shown in an embodiment of the invention.

Step 420—The chain select register is set to enable data compression into the MISR from all MISR input channels.

Steps 430, 440—The seed loaded into the LFSR shadow register is moved to the LFSR, 440. Then, the MISR is initialized (m=1) of the initial test, 430. The BIST test sequence is executed with sufficient cycles of system clocks and channel scan clocks generated to complete a test sequence of "n" user-specified test intervals, and performing the actual test for unstable signatures, 440. At the completion of the n-loops test 440, the MISR contents are stored in the MISR 'shadow' register for comparison in subsequent executions of the n-loops test, 430.

Step 470—The same n-loop BIST test is re-executed using the same seed from the LFSR shadow register. At the conclusion of each test, the MISR contents are XORed with the contents of the MISR 'shadow' register 430.

Step 450—The XOR result is compared with zero.

Step 460—A non-zero XOR result is indicative of signature instability and the need to determine a mask. A result of zero from the XOR operation indicates a repeated signature. The number of test executions is compared to the preset value "m".

Step 480—If the test has executed fewer than "m" times, it is run again for a stable signature check 470.

Step 490—If after "m" user-specified iterations, the XOR result is always "0", it may be assumed that there is no instability, and hence no need for a MISR mask.

Figure 5:
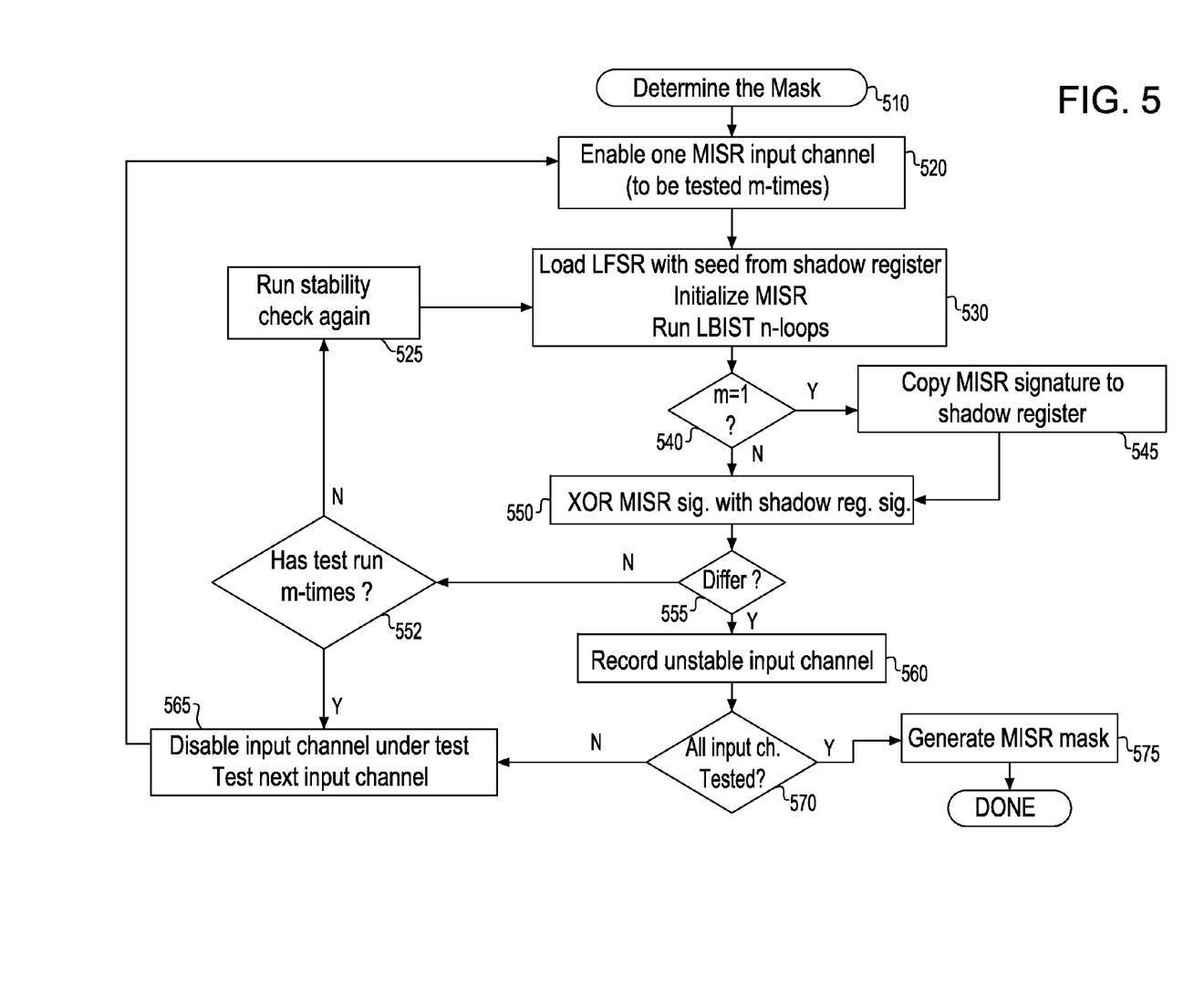
FIG. 5 shows the flowchart process for generating the MISR mask for an unstable signature.

Referring to FIG. 5, masking of unstable MISR input channels is illustrated by describing the process for generating the MISR mask shown in the flowchart 510.

Step 520—All the STUMPS channels are gated off in the chain select register except for one channel at a time being checked in an iterative process over m-times.

Step 530—Under control of the DFT BIST engine, the LFSR is loaded with the initial seed stored in the LFSR shadow register. The MISR is initialized and the n-loop BIST sequence is executed.

Step 545—At the conclusion of the m=1 test, the content of the MISR is moved to the MISR 'shadow' register for comparison on subsequent test iterations 545.

Step 550—The MISR contents are compared to the value stored in the MISR shadow register by shifting both through the XOR comparison circuit.

Step 555—The XOR result value is compared with zero to test for a repeated signature.

Step 552—The signature is repeated. Check that the channel has been tested m-times.

Step 565—The channel's test is complete. Disable the channel, enable the next to be tested, and repeat step 525.

Step 552—The channel's test is not complete. Rerun the test at step 530.

Step 560—A non-zero XOR value, indicative of an unstable value in the currently enabled MISR input channel results in that channel's instability being recorded by setting a corresponding bit in the MISR mask.

Step 570—Check that all channels have been enabled for test one time. If not, execute step 565.

Step 575—At the conclusion of testing all the MISR input channels, the MISR mask is loaded to the channel select register. The stable signature mask is now in effect and traditional manufacturing tests may be applied to the DUT.

Figure 6:
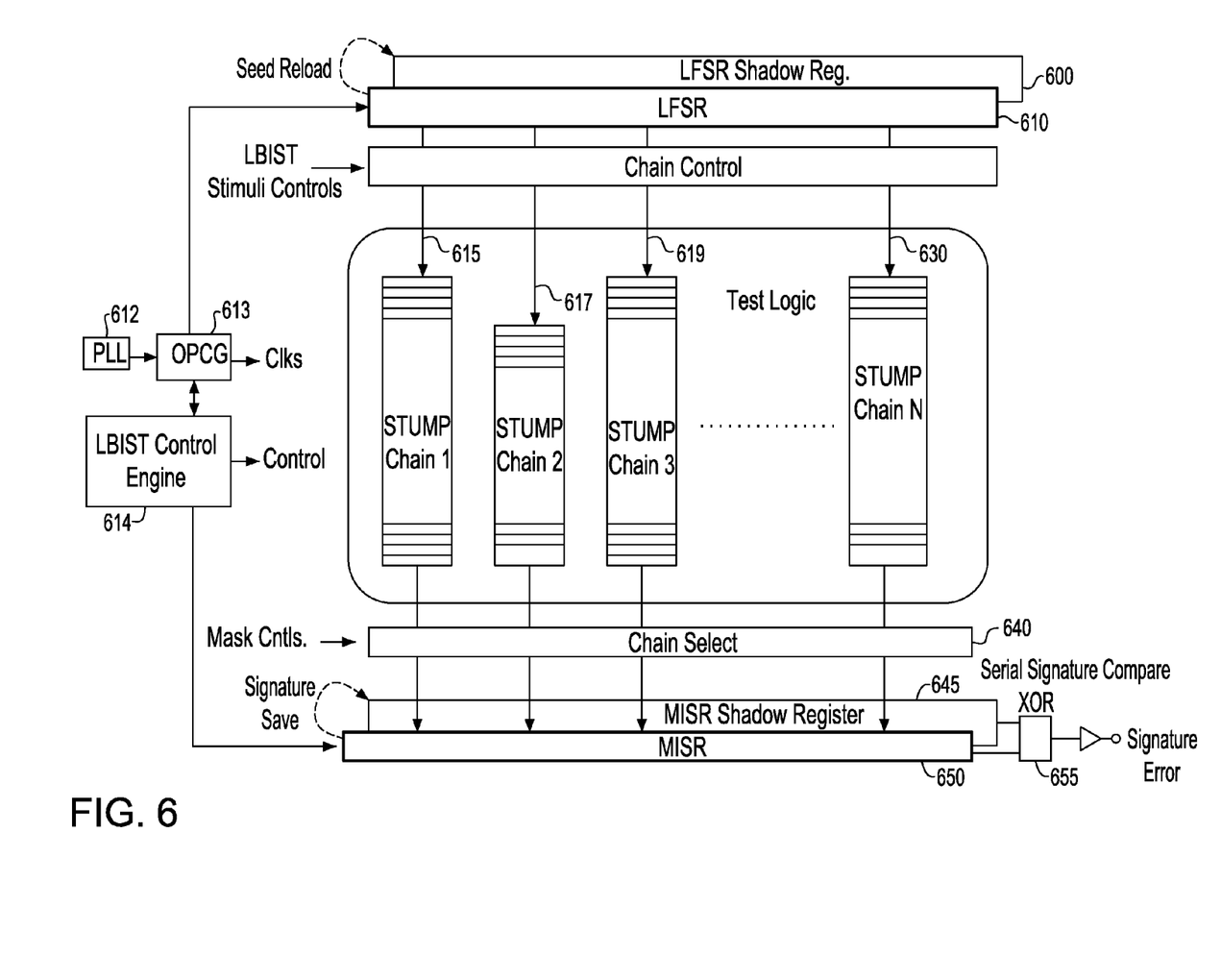
FIG. 6 depicts an unstable signature detect logic built-in self test (LBIST) according with one embodiment of the invention.

Referring to FIG. 6 an embodiment is illustrated describing an unstable signature detect from an LBIST implementation. For illustrative purposes, the DUT is assumed to consist of multiple scan channels referenced as 'STUMPs' channels 615-630 in the configuration. Each STUMP channel can have a different length, i.e. number of latches in the chain, wherein each chain can be thousands of latches long.

Still referring to FIG. 6, the LBIST control or sequencing engine 614 with an associated Phase Lock Loop (PLL) 612 and On-Product-Clock-Generation (OPCG) 613 is illustrated. LBIST stimuli are provided by the LFSR 610 and 'shadow' register 600, while the responses are compressed into the MISR 650, associated shadow register 645 and mask register 640. A serial signature comparator is shown by XOR Step 655.

In actual chip designs, the LBIST STUMPs structure can be repeated multiple times per chip and often multiple instances per core or macro on each chip.

Figure 7:
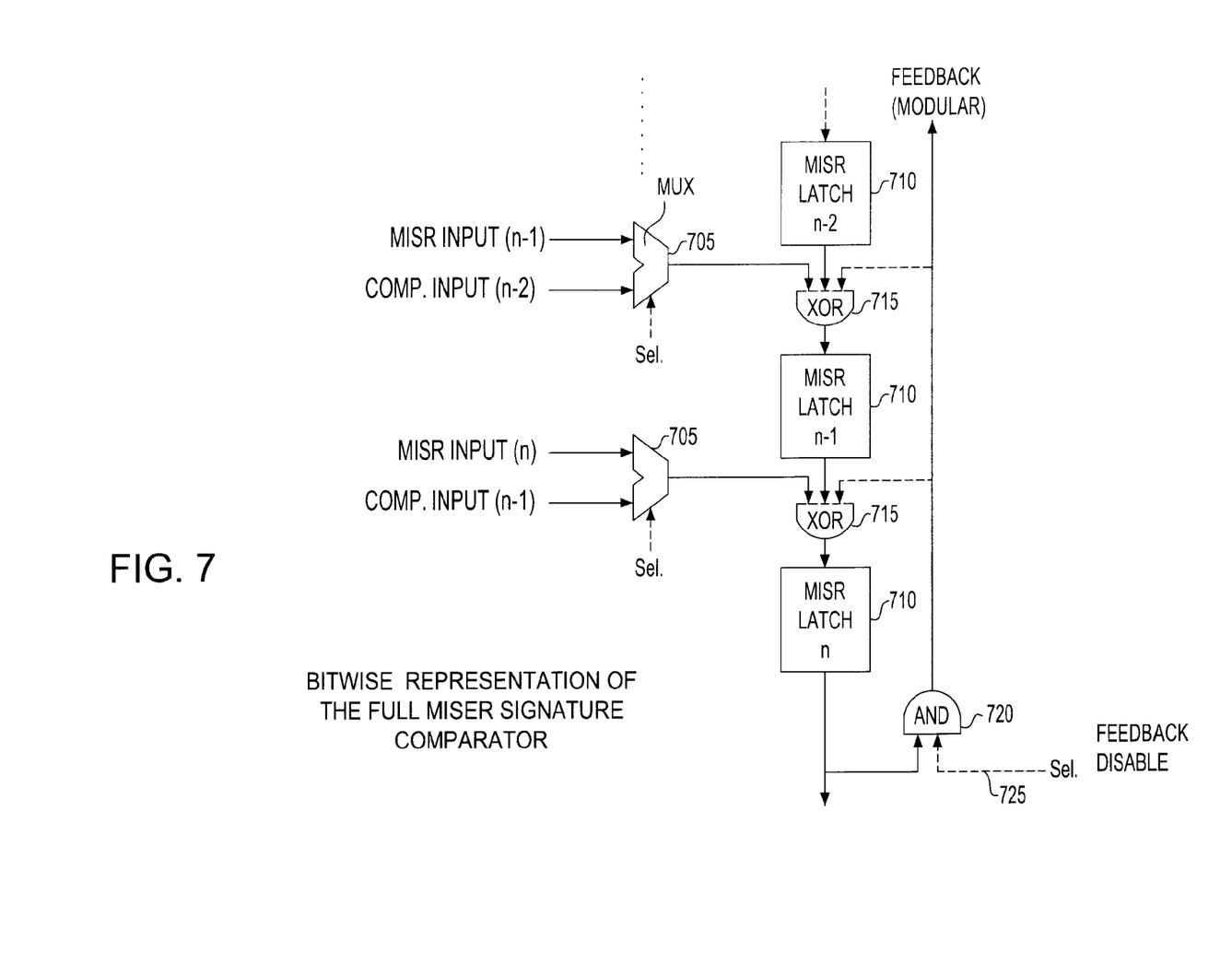
FIG. 7 shows a MISR as a comparator function illustrating a 'modular' LFSR used as an N-bit input MISR and/or as a full N-bit single cycle signature comparator.

Referring now to FIG. 7, the MISR shown having a comparator function is described. A typical 'modular' configuration LFSR used as an N-bit input MISR and/or a full N-bit single cycle signature comparator is illustrated. The integrated comparator function compares one of the selected inputs to the contents of the MISR. The result of the compare cycle is an all "0s" register content in the MISR for a matching signature condition.

Step 710—Shown is a portion of a typical MISR chain, i.e., last three latches in the drawing (n-2 to n). A typical MISR length used in current designs range from tens to hundreds latches, with an input for each latch. Furthermore, each chip design can incorporate multiple instances of diverse MISR configurations.

Step 705—The MUX and associated 'sel.' control signal allow the MISR input from the logic to be tested or from an alternate source to be compared to the current contents of the MISR.

Step 715—The XOR between each MISR latch combines logically the output of the previous MISR latch, the selected input, and optionally, a feedback from the n-th latch of the MISR. Typically the feedback tap being selected is optimized for a 'maximal' length LFSR configuration.

Step 720—The AND gate disables the feedback (i.e. set all feedback taps to "0" via 725) during the compare operation.

In summary, the method as described extends over two areas, enabling BIST operation in designs with unstable signatures, and minimizing the number of test pattern generation iterations. Moreover, it enables multiple and rapid unstable signature detections for large pseudo-random pattern sequences with minimal test generation and simulation.

Further provided is an automated generation of MISR channel masks, while minimizing the number of diagnostic iterations to isolate multiple unstable signatures. The current method is applicable to and effective on the full environmental operating range of the device, and is applicable to many levels of test, from wafer to system in the field.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method for detecting unstable signatures when testing a VLSI chip comprising:
    a) adding to a linear feedback shift register (LFSR) one or more save and restore registers for storing an initial seed consisting of 0s and 1s;
    b) loading said initial seed into said LFSR and said one or more save and restore registers;
    b') initializing a MISR and running test loops, and upon reaching a predetermined number of test loops moving a signature of said MISR to a shadow register; and
    c) performing a signature stability test by loading said initial seed to said LFSR, executing said predetermined number of BIST test loops, and comparing a resulting MISR signature for differences versus a previous signature stored in a MISR save and restore a register, wherein unloading is performed by way of serial MISR unloads and single bit XORs.

2. The method of claim 1, wherein at each additional run from said initial seed into said LFSR, comparing said resulting MISR signatures against corresponding signatures stored in said MISR save and restore register.

3. The method of claim 1, further comprising flagging as an unstable test condition upon finding a mismatch occurring during a repeatability count of a predetermined number of test intervals, said flagging being an unstable test condition for said predetermined number of said test intervals.

4. The method of claim 1, wherein an input data stream for each of said MISR comprises an input channel per MISR latch.

5. The method of claim 1, wherein each of said MISR is provided with a corresponding save and restore register.

6. The method of claim 1, wherein a built-in diagnostic function complements a built-in self test (BIST), generating a stable signature mask.

7. The method of claim 1 further comprising a MISR integrated comparator function that compares one of selected inputs to contents of said MISR.

8. The method of claim 1, further comprising sequencing BIST controls to isolate unstable channels.

9. The method of claim 1, further comprising providing a design-for-test (DFT) that automatically detects multiple unstable signatures and associated instability source channels.

10. The method of claim 9, wherein said DFT further comprises:
   a) providing to said LFSR one or more save and restore registers:
   b) providing an individual MISR input channel and a mask select sequence controller;
   c) saving support using a save and restore register for a previous MISR signature;
   d) comparing said signatures using serial XORs; and
   e) enhancing said BIST controller looping and sequencing said MISR input channels.

11. The method of claim 10 further inputting a data stream for said MISR input channel, comprising one input channel per MISR latch.

12. The method of claim 1, further comprising a built-in diagnostic complementing said BIST test, generating a stable signature mask.

13. The method of claim 1, further comprising:
   i) a BIST engine controlling test sequences;
   ii) save and restore registers for said LSFR and said MISR;
   iii) channel select registers to gate MISR inputs; and
   iv) integrating signature compare functions.

14. The method of claim 1, further comprising a plurality of signature compares.

15. The method of claim 1, further comprising a plurality of MISR input channels extending instability detections and multiple stable MISR masks generations.

16. The method of claim 1 further comprising a signature comparator providing a comparison between a current MISR signature and a previous equivalent test interval signature stored in said MISR save and restore register, wherein matching signatures indicating that said test interval produces a stable response.

17. A method for detecting unstable signatures when testing a VLSI chip comprising:
   a) adding to a linear feedback shift register (LFSR) one or more save and restore registers for storing an initial seed consisting of 0s and 1s;
   b) loading said initial seed into said LFSR and said one or more save and restore registers:
   b') initializing a MISR and running test loops, and upon reaching a predetermined number of test loops moving a signature of said MISR to a shadow register; and
   c) performing a signature stability test by loading said initial seed to said LFSR, executing said predetermined number of BIST test loops, and comparing a resulting MISR signature for differences versus a previous signature stored in a MISR save and restore a register wherein said MISR similar to said LFSR with additional inputs to a XOR between MISR latches, enabling a response compression into a digital signature of a length equal to the number of said MISR latches.

18. The method of claim 17, wherein said MISR is employed as a multiple independent signature generator said MISR taking a modular or standard feedback configuration.

19. The method of claim 17, wherein a BIST control or sequencing engine with associated phase lock loop (PLL) and on-product-clock-generation (OPCG). BIST stimuli control latches are similar to a MISR mask controlling or modifying the stimuli from said LFSR or a Pseudo-Random Pattern Generator (PRPG) to an input of each test channel chain.

* * * * *